(12) United States Patent
Yu et al.

(10) Patent No.: US 8,754,412 B2
(45) Date of Patent: Jun. 17, 2014

(54) INTRA DIE VARIATION MONITOR USING THROUGH-SILICON VIA

(75) Inventors: Xiaojun Yu, Hopewell Junction, NY (US); Anda C. Mocuta, Hopewell Junction, NY (US); Toshiaki Kirihata, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 2 days.

(21) Appl. No.: 13/342,226

(22) Filed: Jan. 3, 2012

(65) Prior Publication Data
US 2013/0168673 A1    Jul. 4, 2013

(51) Int. Cl.
*H01L 29/10*    (2006.01)

(52) U.S. Cl.
USPC .............. 257/48; 257/E21.531; 257/E23.001; 257/686; 257/758; 257/777; 438/18

(58) Field of Classification Search
USPC ............ 257/48, E21.531, E23.001, 786, 758, 257/777; 438/18
See application file for complete search history.

(56) References Cited

U.S. PATENT DOCUMENTS

| | | |
|---|---|---|
| 5,977,558 A | 11/1999 | Lee |
| 6,239,603 B1 | 5/2001 | Ukei et al. |
| 6,967,110 B2 | 11/2005 | Guldi et al. |
| 7,148,715 B2 | 12/2006 | Akram et al. |
| 7,194,706 B2 | 3/2007 | Adkisson et al. |
| 7,220,990 B2 | 5/2007 | Aghababazadeh et al. |
| 7,239,163 B1 | 7/2007 | Ralston-Good et al. |
| 7,385,412 B2 | 6/2008 | Akram et al. |
| 7,736,916 B2 | 6/2010 | Aghababazadeh et al. |
| 7,852,103 B2 | 12/2010 | Bartley et al. |
| 7,868,606 B2 | 1/2011 | Meterelliyoz et al. |
| 8,000,935 B2 | 8/2011 | Logan |
| 8,004,305 B2 | 8/2011 | Jenkins et al. |
| 2009/0144024 A1 | 6/2009 | Oppold |
| 2010/0323462 A1 | 12/2010 | Anderson et al. |
| 2011/0042820 A1 | 2/2011 | Knickerbocker |
| 2011/0309357 A1* | 12/2011 | Tain et al. .................. 257/48 |

\* cited by examiner

*Primary Examiner* — Elias M Ullah
(74) *Attorney, Agent, or Firm* — Ian MacKinnon; Steven Kellner; William Steinberg

(57) ABSTRACT

An apparatus comprising connecting IDVMON monitors with through silicon vias (TSV) to allow the monitors to be connected to probe pads located on the backside of the wafer. Because the backside of the wafer have significantly more space than the front side, the probe pads for IDVMON can be accommodated without sacrificing the silicon area.

7 Claims, 10 Drawing Sheets

INTRA DIE VARIATION MONITOR USING THROUGH-SILICON VIA

FIELD OF THE INVENTION

The present invention relates to methodologies and apparatus for monitoring within die variations caused by local process variability within semiconductor chips.

BACKGROUND

In the microelectronic fabrication industry, there is often a need to evaluate the effect of local process variability on individual transistors across a chip. For example, often times data pertaining to electrical properties of field effect transistors (FETs) based on variations in a process is required. More specifically, it may be required to evaluate the variation of PFET and NFET threshold voltage with respect to process environment variations experienced during fabrication. As an example, threshold voltage (Vt) may vary within a chip; for example, due to variations in gate length caused by reactive ion etching (RIE) load variation or photo resist planarization variations. In another example, a pattern density of various material stacks can modulate the rapid thermal anneal (RTA) temperature locally and may cause as much as 100 mV variation in threshold voltage (Vt) within a chip. One approach to this problem is to measure an electrical property of multiple transistors and then to characterize across chip variation based on those measurements. This approach, however, can require a very large sample size of transistors to provide adequate data for variations over many length scales. For example, the characterization does not enable an evaluation of a direction of the process environment variation on the chip.

Within chip variation impact on product power-performance and circuit functionality is increasingly important. Various structures have been developed to monitor the within chip variation, and currently the most powerful solution is to place embedded within-chip variation monitor or intra die variation monitors (IDVMON). IDVMON is a small structure containing a few key devices that can be subsequently measured; IDVMON are placed numerous times across chip, in space not used by other circuits or structures. The threshold voltage and device current may be measured for a transistor that is part of IDVMON. When a resistor is utilized the resistance variation amongst the multiple IDVMONs utilized. In addition to quantification of within-chip variation, IDVMON can also serves as a structure to debug and calibrate product line-centering by measuring the product-kerf offset. Direct measurement of across-chip variation provides detailed information for variation reduction efforts. Identical structures to monitor offset between functional blocks and provide guidelines for line centering.

Measuring the electrical properties of devices embedded in IDVMON currently requires additional CA and M1 masks (contact A and metal 1 masks), which may result in a cost increases. The IDVMON specific CA/M1 masks are used to wire IDVMON to large probe pads, which will enable test. The probe pads consume large area, particularly on M1. Therefore within chip variation monitors and product and characterization circuits cannot be wired up on the same wafer as a standard production wafer because the IDVMON CA/M1 layers will consume large amount of metal wiring space. Therefore the IDVMON CA/M1 is different from the POR mask. POR is a process of record mask or standard mask which utilizes standard procedures for manufacture. Wafers running with an IDVMON mask, have to be sacrificed which prevents characterizing these structures frequently in production runs.

Recently, there is a strong demand to enable a 3D VLSI chip by stacking two or more chips. 3D VLSI chips employ Through-Silicon Vias (TSVs) in the wafer. The devices used in 3D VLSI chips may have different device characteristics from those in conventional 2D VLSI chips because of the proximity effect between device and TSV, and wafer thinning effect. It is important to study the 3D process impact on device variability during development and manufacturing. The purpose of this invention is to provide an IDVMON for 3D VLSI chips development and manufacturing.

SUMMARY

The inventors have proposed a new and novel approach to allow for the use of IDVMONs without the need to utilize a separate CA/M1 mask for 3D VLSI chips. More specifically, the inventors propose connecting IDVMON monitors with through silicon via (TSV) to allow the monitors to be connected to probe pads located on the backside of the wafer. Because the backside of the wafer have significantly more space than the front side, the probe pads for IDVMON can be accommodated without sacrificing the silicon area. By utilizing the TSV to provide access to the IDVMON, the inventors not only permit testing of the wafer without damaging the wafer to access the test probe pads, but they allow for continuous testing beyond the first CA/M1 layer. The advantages of utilizing these embodiments described and claimed include: (a) no added cost (for CA/M1 mask) by utilizing the invention the IDVMON may be incorporated into the production mask by placing it in locations that are not in contact with the production; (b) since the IDVMON is incorporated into the production mask, the same wafer can be utilized for both within-chip variation study and product characterization, (c) increases flexibility for product yield debug by direct monitoring of IDVMON closer to the primary die areas, (d) Enables backside probing for the IDVMON (e) allows to study the device effect because of the non-fill, TSV to device proximity, and wafer thinning effect. for 3D chip.

Through-silicon via for 3D-integration is emerging as a new technology offering. Typically TSV density is very sparse because they are mostly used for wiring between large functional blocks. The low density allows us to utilize TSV to wire up IDVMONs that may be distributed across the chip. IDVMON is used to monitor layout density pattern driven within chip variation and thus can be sparsely placed every 1-2 mm. With such a low placement density, the inventors have determined that through silicon via is an ideal choice to wire up IDVMONs for probe testing.

The detailed implementation includes the IDVMON and probe pad arrangement between TSVs with various spacing between TSV and the devices on IDVMON. The IDVMON may be included in the center of the annular TSV thereby utilizing space that otherwise goes unused.

DETAILED DESCRIPTION

Figure 1:
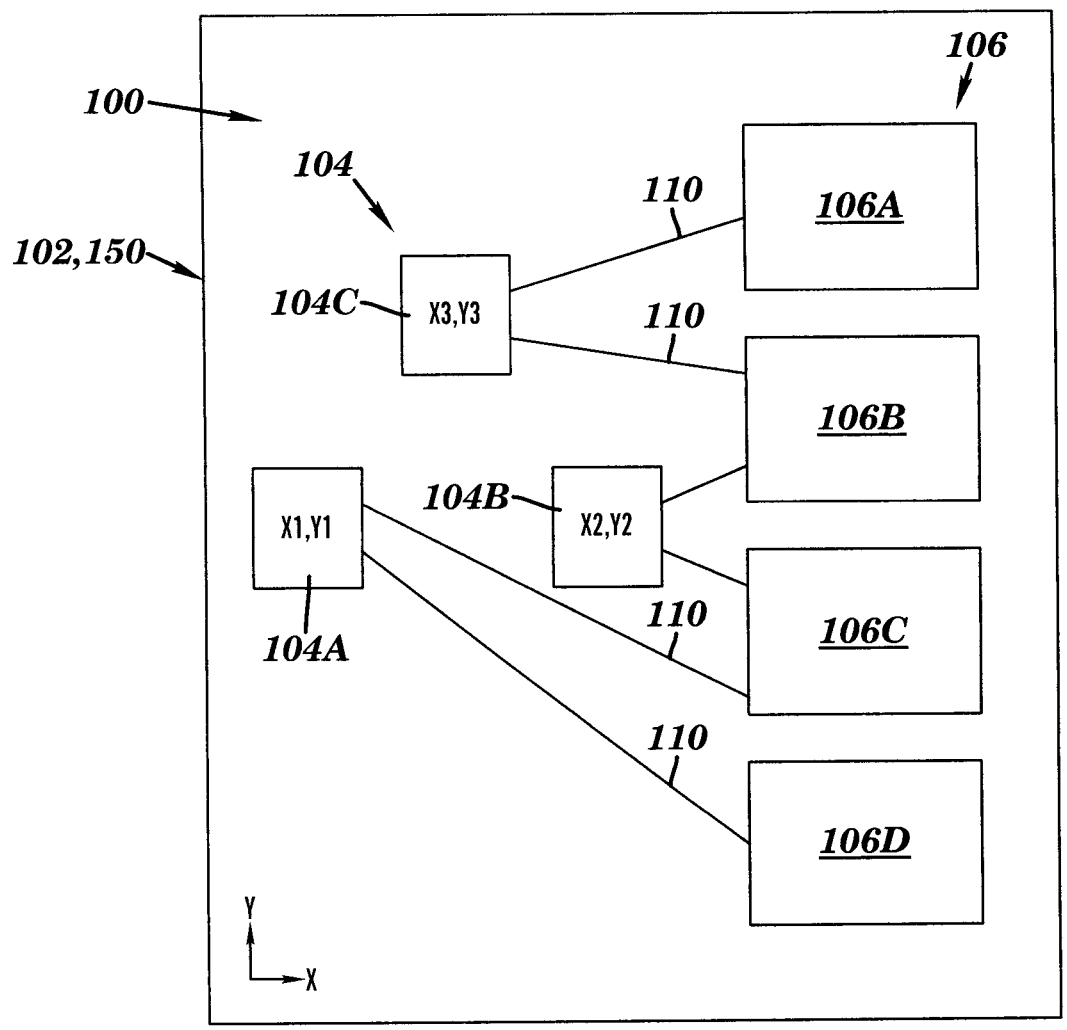
FIG. 1 shows one embodiment of a structure for evaluating process environment variation according the prior art.

Referring to the drawings, FIG. 1 shows prior art embodiment of a structure 100 for evaluating the effect of a process environment variation across a chip 102. Structure 100 includes a plurality of electrical structures 104 arranged in a non-collinear fashion for determining a magnitude and a direction of a process environment variation in the vicinity of plurality of electrical structures 104. The process environment variation may include practically any environmental characteristic that varies during a particular fabrication process, e.g., etching, annealing, material deposition, ion implanting, etc. For example, a process environment variation may include a spacer etch variation, a photolithography exposure variation, a gate length variation, a variation in film deposition, and an anneal temperature gradient. While three electrical structures 104A-C are shown, it is understood that any number of electrical structures 104 greater than or equal to three may be used. Each electrical structure is positioned at an X-coordinate and a Y-coordinate within chip 102 such that the three (or more) structures are not collinear. As illustrated, only electrical structures 104A and 104B share a Y coordinate, i.e., Y1Y2. In one embodiment, where three electrical structures 104A-C are used, this results in a substantially triangulated arrangement. The triangular arrangement does not need to be any particular type of triangle, e.g., isosceles, right, etc. Electrical structures 104A-C are interconnected, via interconnects 110, to a plurality of probe pads 106. As illustrated, electrical structures 104A-C are interconnected by four probe pads 106A-D, but more may be employed where more electrical structures 104 are used.

Figure 2A:
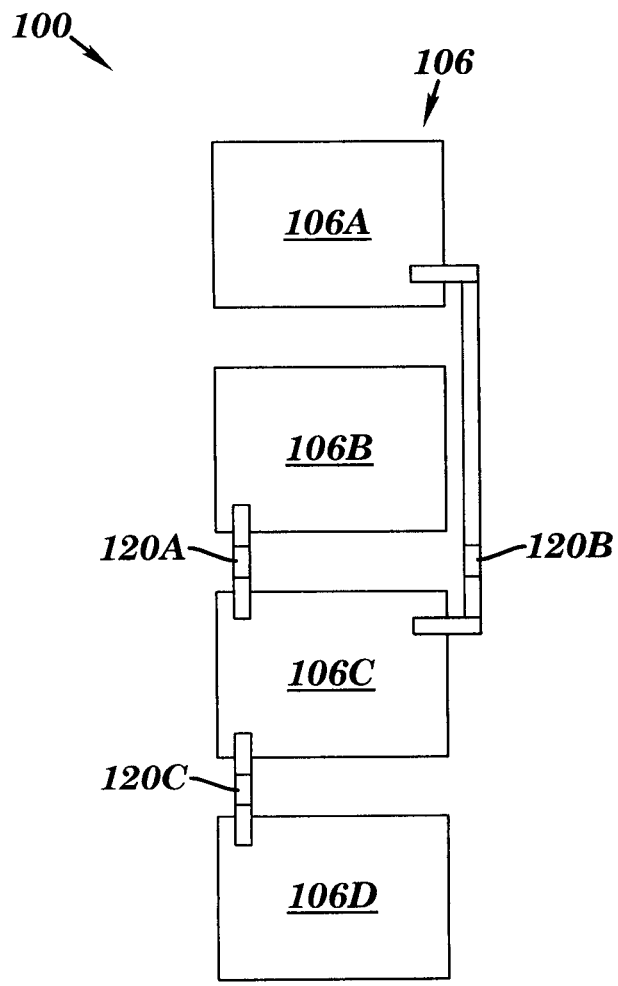
FIG. 2A shows a first embodiment of an electrical structure used in the structure of FIG. 1 including resistors according the prior art.
Figure 2B:
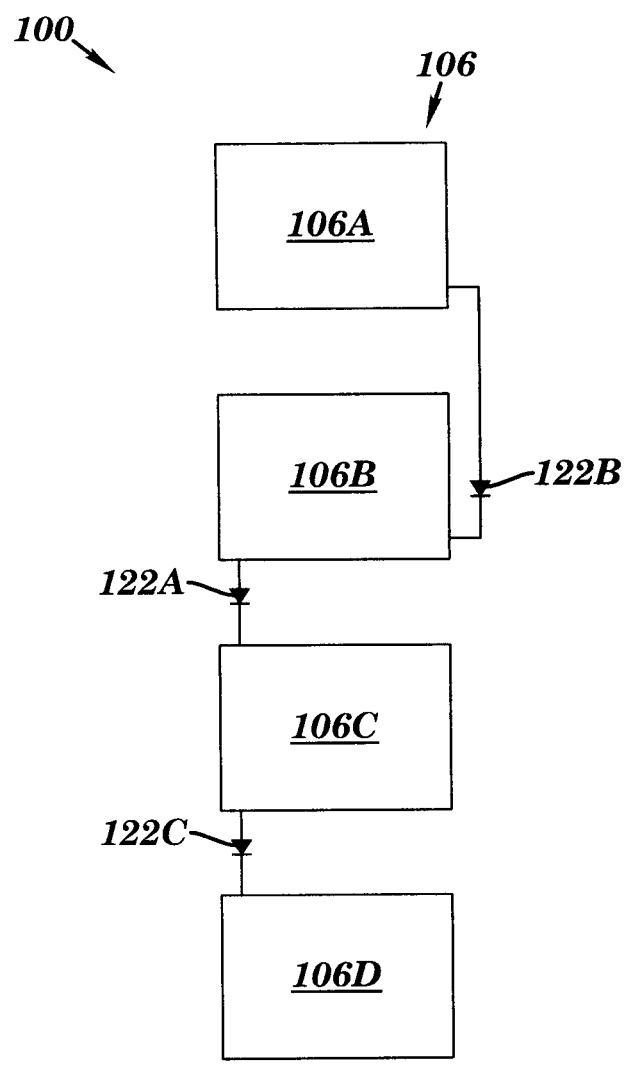
FIG. 2B shows a second embodiment of an electrical structure used in the structure of FIG. 1 including diodes according the prior art.
Figure 2C:
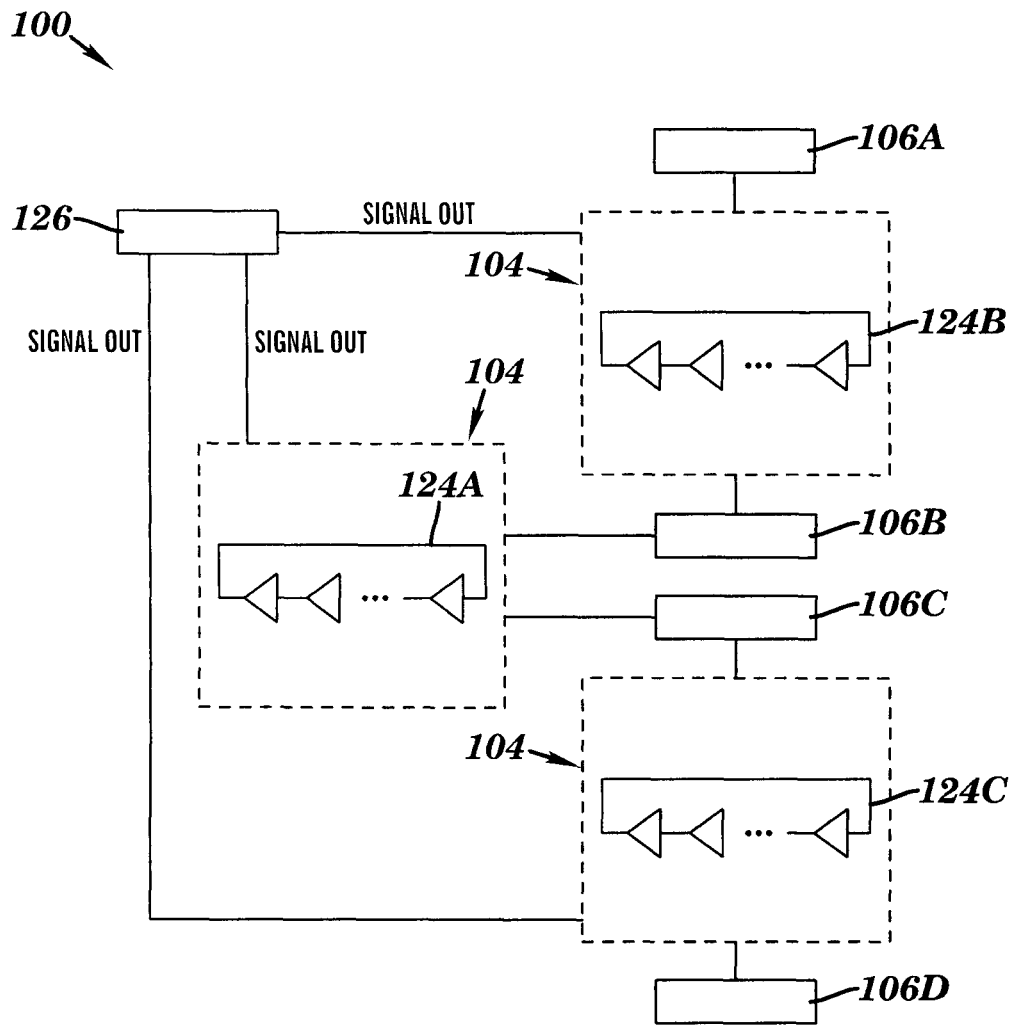
FIG. 2C shows a third embodiment of an electrical structure used in the structure of FIG. 1 including ring oscillators according the prior art.

Electrical structures 104 may take the form of a variety of different electrical devices. In one embodiment, electrical structures may each include a resistor, a diode or a ring oscillator. In this case, each end (input or output) of the aforementioned devices are coupled as indicated in FIG. 1. FIG. 2A shows another prior art embodiment employing doped polysilicon resistors 120A-C. As illustrated, resistors 122A-C are interconnected to probe pads 106A-D. FIG. 2B shows another prior art embodiment employing diodes 122A-122C. As illustrated, diodes 120A-C are interconnected to probe pads 106A-D. FIG. 2C shows another embodiment employing ring oscillators 124A-C. As illustrated, ring oscillators 124A-C are interconnected to probe pads 106A-D, and output signals of each ring oscillator 124A-C are connected to a signal probe pad 126.

Figure 3:
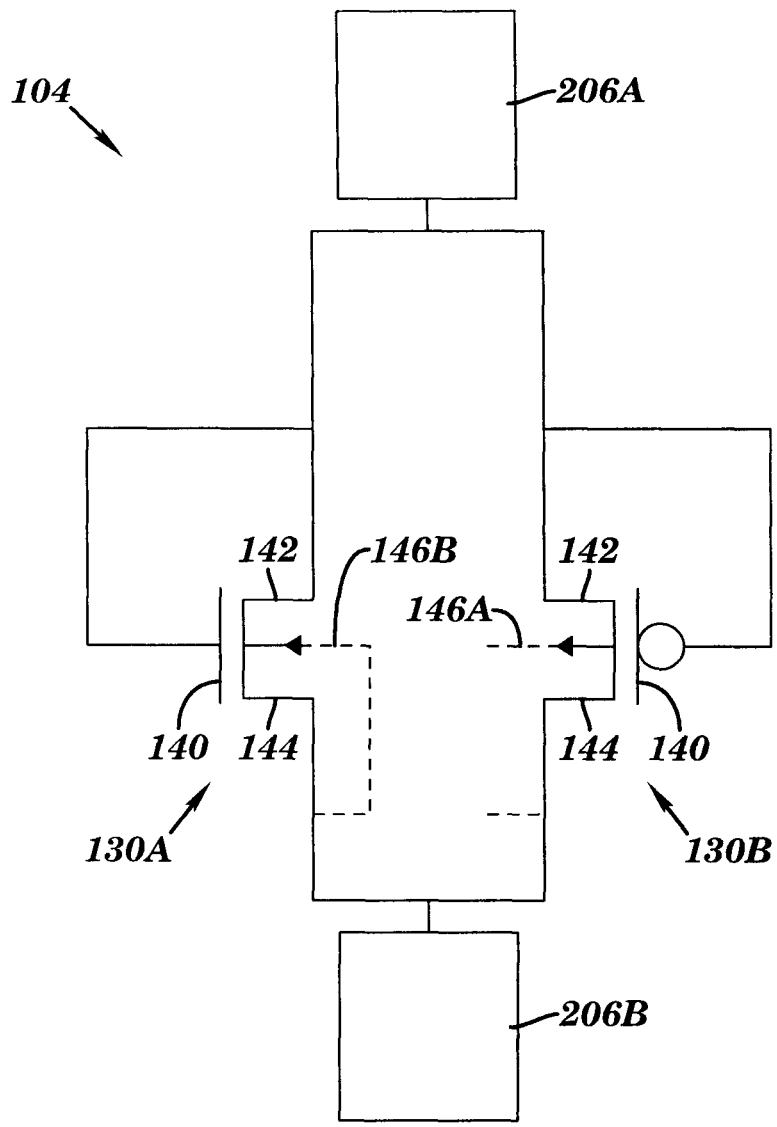
FIG. 3 shows a forth embodiment of an electrical structure used in the structure of FIG. 1, including transistors.

Turning to FIG. 3 in another prior art embodiment, each electrical structure 104 may include a plurality of transistors. In FIG. 3, two transistors 130A-B are shown, respectively. However, it is understood that any number of transistors 130A-B greater than or equal to two may be used. In the transistor embodiment, each electrical structure 104 may include a first polarity field effect transistor (FET), e.g., a NFET 130A, coupled to a second polarity FET, e.g., a PFET 130B. It is understood that the position of each type FET may be switched from what is illustrated. First polarity FET 130A and second polarity FET 130B are each coupled to a first probe pad 206A and a second probe pad 206B. With this structure, independent measurement of first polarity FET 130A and second polarity FET 130B using only first probe pad 206A and second probe pad 206B is made possible. The electrical property measured may be varied depending on the particular structure provided.

With specific reference to FIG. 3, in one version of the transistor embodiment of electrical structure 104, gates 140 and drains 142 of first polarity FET 130A and second polarity FET 130B are coupled to first probe pad 206A, and sources 144 of first polarity FET 130A and second polarity FET 130B are coupled to second probe pad 206B. In this case, each electrical structure 104 employs measurement of a threshold voltage (Vt).

As can be seen in the prior art designs the probe pads such as 206A and 206B are not easily accessed for testing. As stated above to access the probe pads the wafer must be sacrificed to be accessed. The issue of the probe pad location causes a conflict between ACV (across chip variation) readout in early product providing enough hardware for ramp up analysis. Functional study and variation study are not using the same hardware, and disallow non-interrupting ACV monitoring.

A most fundamental concern of the existing IDVMON approaches is a probe pad and their arrangement, because a probe pad set requires not only a large area but also blocks the wiring. This results in using unique mask sets only for IDVMON, however this approach is not preferred because the IDVMON cannot use used for the actual product routing as discussed. To enable the product mask set without sacrificing the expensive silicon area in a product, the inventors have a new and novel invention. The inventors have determined by utilizing TSV (Through Silicon Vias) the IDVMON may be tested from probe pads located on the backside of the wafer. Arranging the probe pad set on the back side overcomes the probe pad area and their arrangement concern, because the wafer back side has significantly more free space than the front side.

Figure 4:
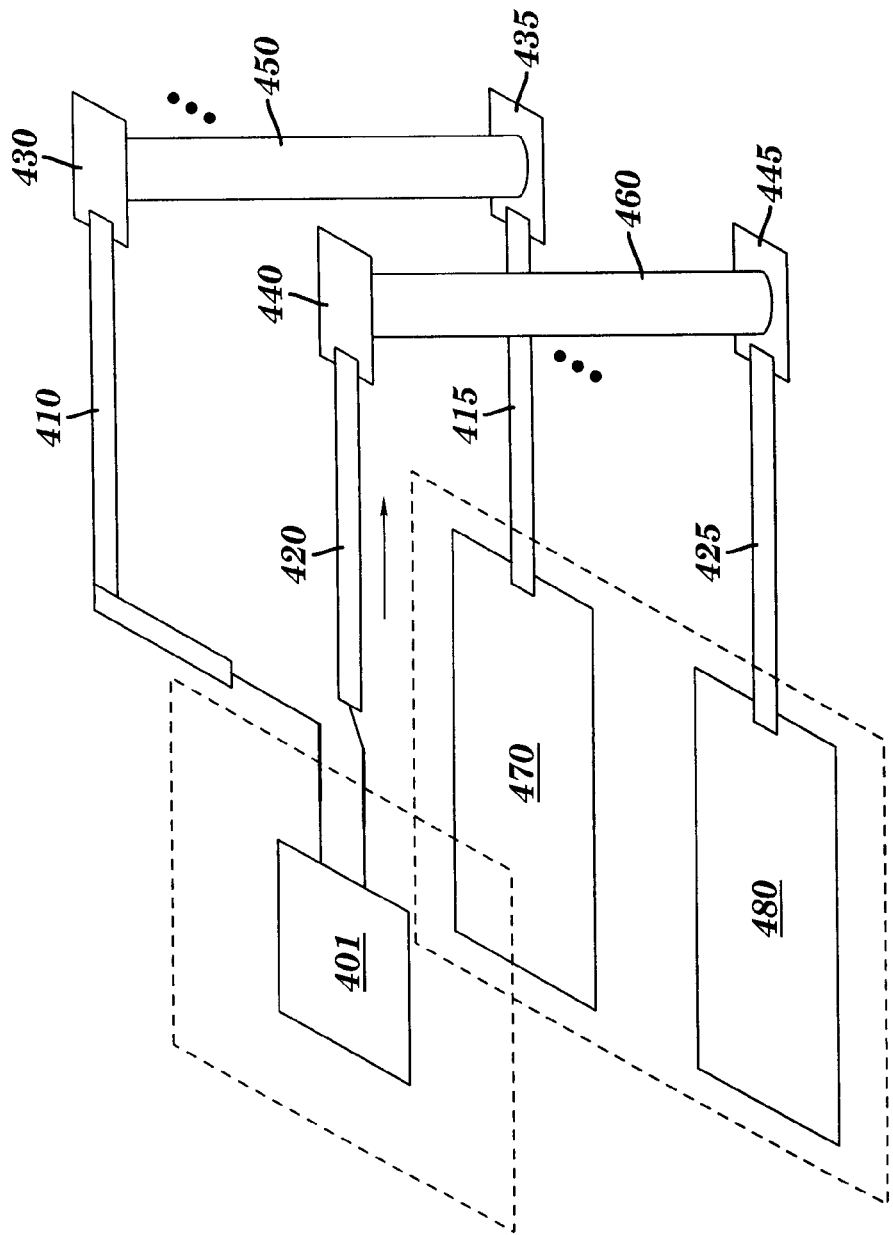
FIG. 4 illustrates a three dimensional top view of an embodiment of the invention.

FIG. 4 illustrates a three dimensional top view of an embodiment of the invention. IDVMON 401 may be located on the kerf of the wafer or other free space and on a layer determined by the designer. Lines 410 and 420 are provided to connect IDMOV 401 with capture pads 430 and 440 respectively. Capture pads 430 and 440 are in electrical contact with TSVs 450 and 460. TSVs 450 and 460 are in electrical contact with capture pads 435 and 445 respectively. Capture pads 435 and 445 are located on the bottom layer of the wafer and connected via lines 415 and 425 respectively to back side probe pads 470 and 480. In this embodiment it is noted that the probe pads 470 and 480 are significantly larger than IDVMON 401 itself. Although the invention requires TSVs and capture pads, the silicon overhead for TSV w/5 um diameter is <1% of conventional >50 um probe pad arrangement. In addition, some 3D technology may require dummy TSVs to improve the TSV processes. Therefore, the dummy TSVs may be used for the backside probe pad connection for the IDVMON. By either providing TSVs for the IDVMON or utilizing unused TSVs for the IDVMON the inventors have provided a means wherein the IDVMON may be monitored without damaging the product wafer. In addition, since the IDVMON is accessible via the backside probe pads, the IDVMON may be tested repeatedly as additional layers are added right up until the final layer is provided. IDVMON is preferably arranged near the TSVs 430 and 440, which allows us to detect the TSV and IDVMON proximity effect as well as the IDVMON characteristic change during the 3D wafer thinning process.

Figure 5:
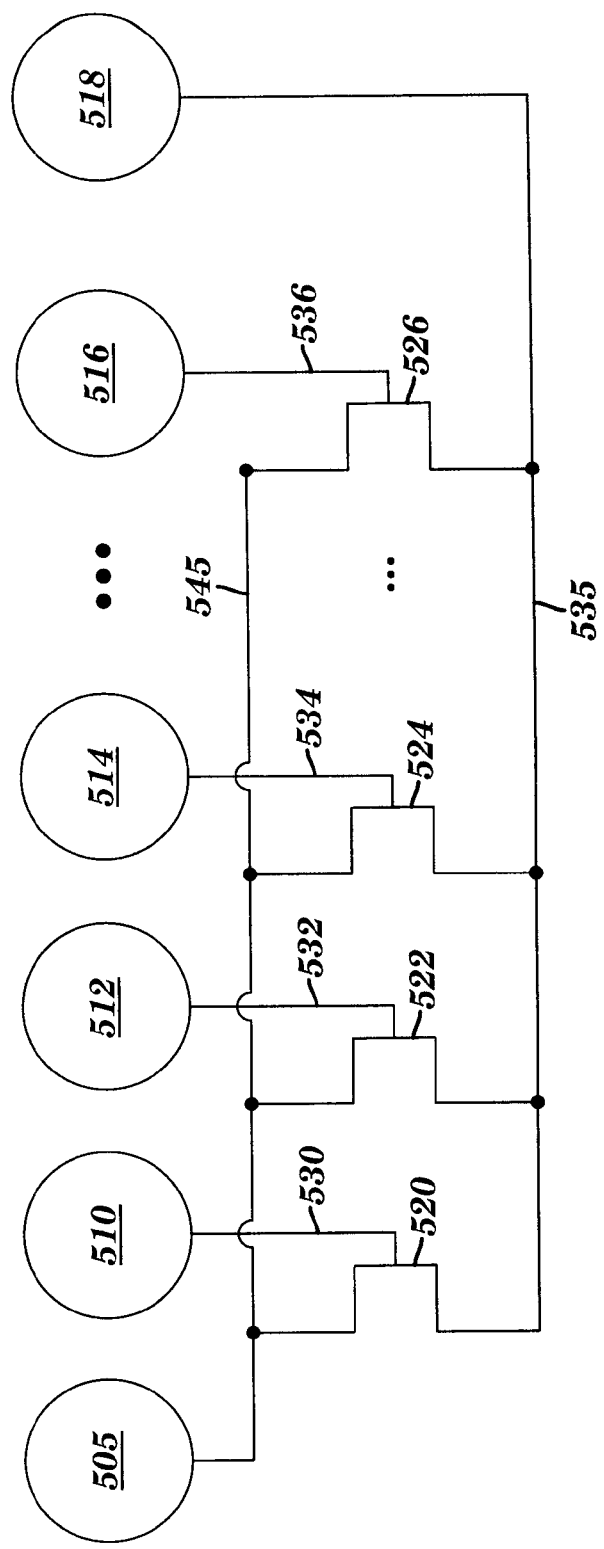
FIG. 5 illustrates a schematic diagram of multiple IDVMONs connected via TSVs to the Backside of the wafer.

FIG. 5 illustrates a schematic diagram of multiple IDVMONs located on the front side of the wafer connected to TSVs 510, 512, 514, 516, and 518 on the front side of the wafer. The TSVs are connected to probe pads (not shown) on the backside of the wafer. The schematic illustrates a plurality of IDVMONs 520, 522, 524, and 526 in this case FETs. While only four IDVMONs are shown, it should be clear that any number of IDVMONs may be provided based on the desires of the design engineer. Each IDVMON is electrically connected via a line to a TSV. IDVMON 520 is connected via line 530 to TSV 510, in a similar manner IDVMON 522 is connected via line 532 to TSV 512. In the same manner IDVMON 524 and 526 are connected via lines 534 and 536 to TSVs 514 and 516 respectively. One end of each of the IDVMONs 520, 522, 524, and 526 is connected via line 545 to TSV 505 the other end of each of the IDVMONs is connected via line 535 to TSV 518. In this manner each of the IDVMONs may be connected together and located through the wafer while allowing the TSVs to connect to a probe pad (not shown) on the backside of the wafer.

Figure 6:
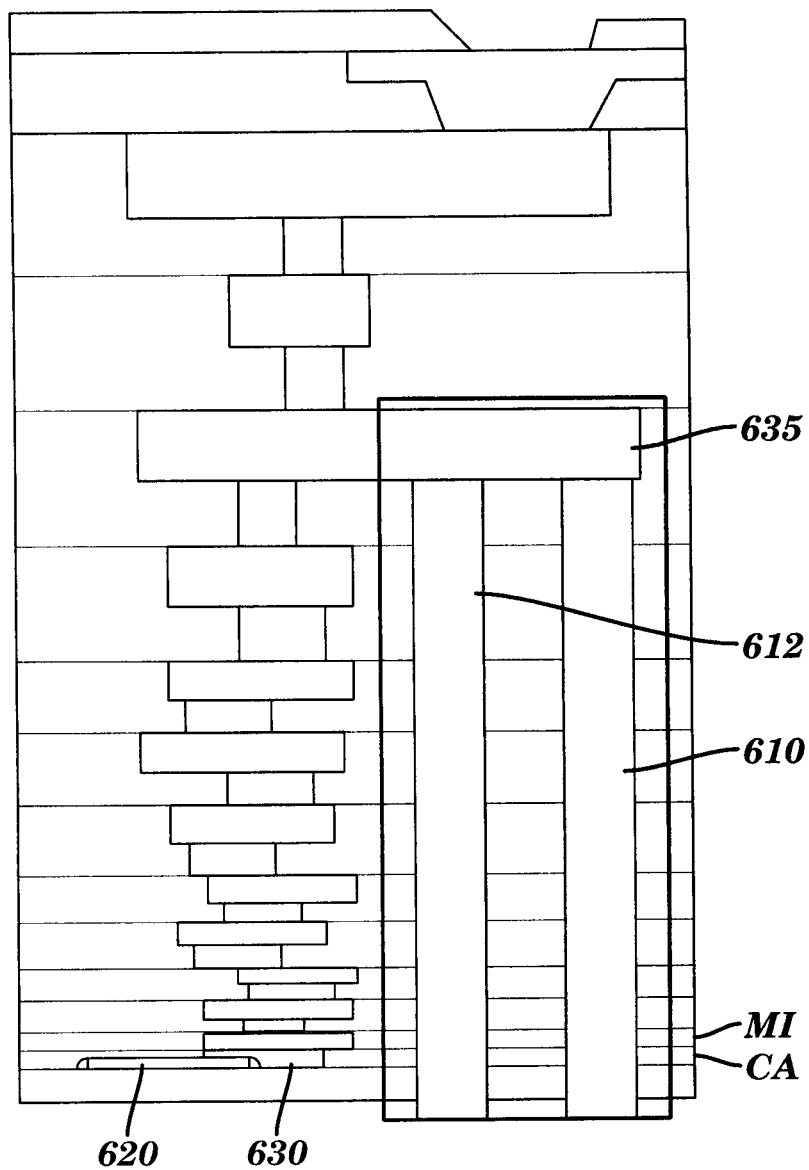
FIG. 6 illustrates a schematic representation of stratum P back end of line (BEOL).
Figure 6A:
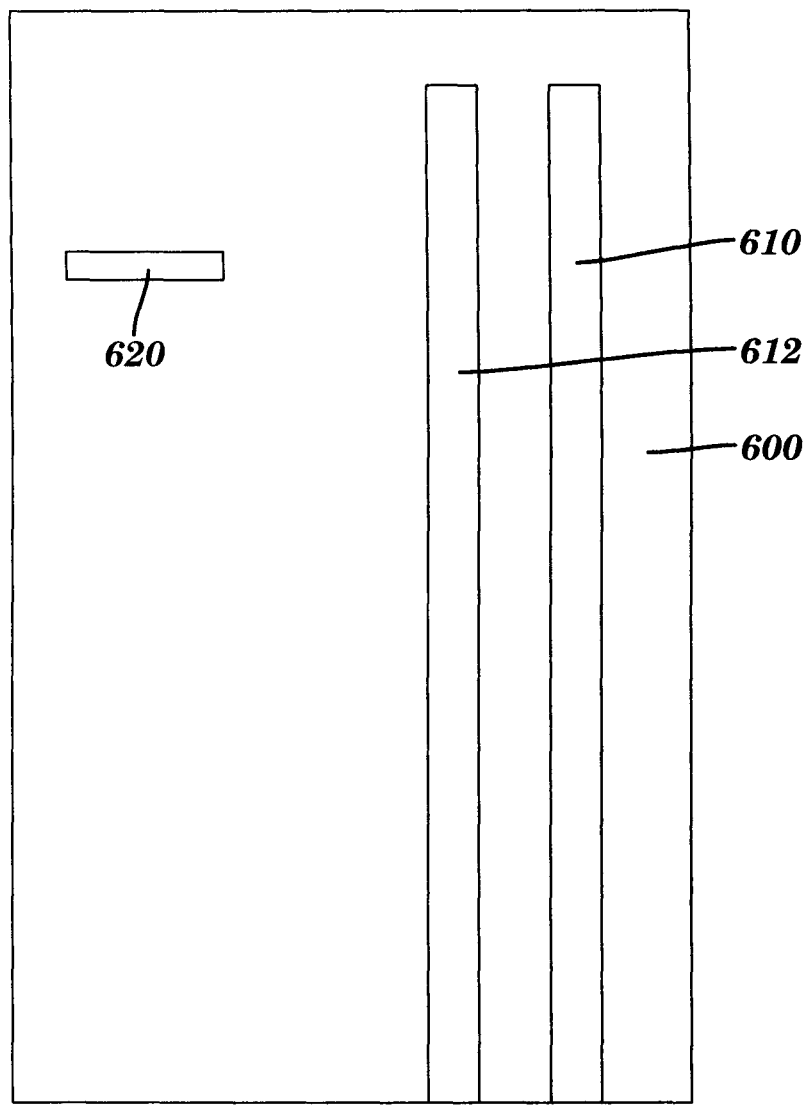
FIG. 6A illustrates a cross section view of the wafer.

FIG. 6 illustrates a cross section of a wafer with TSVs, which includes backend of line (BEOL). The illustration provides how an IDVMON 620 provides a connection via lines 630 through lines 635 to TSV 612 and TSV 610. The connection via line 630, in this example, includes metal 1-10 to connect the TSV 610, where the metal 10 is the capture metal (or capture pad). The IDVMON 620 is located on Contact layer A, CA. The IDVMON 620 may be located on the kerf or other free space. In this example, the TSV 610 is coupled to a higher metal layer (metal 10); however this can be connected to any other metal layer (i.e. metal 1). It is important to know that stacking the metal near TSVs does not penalize the expensive silicon area, because the area cannot be used for device and their wiring. This is because the TSV blocks the wiring layers and the area cannot be used for a device to avoid a device proximity effect (device keep out zone). FIG. 6A illustrates a cross section view of the wafer 600 illustrating that IDVMON 620 is located on the front side of the wafer 600 and the TSV's 610 and 612 pass through to the backside of the wafer.

Figure 7:
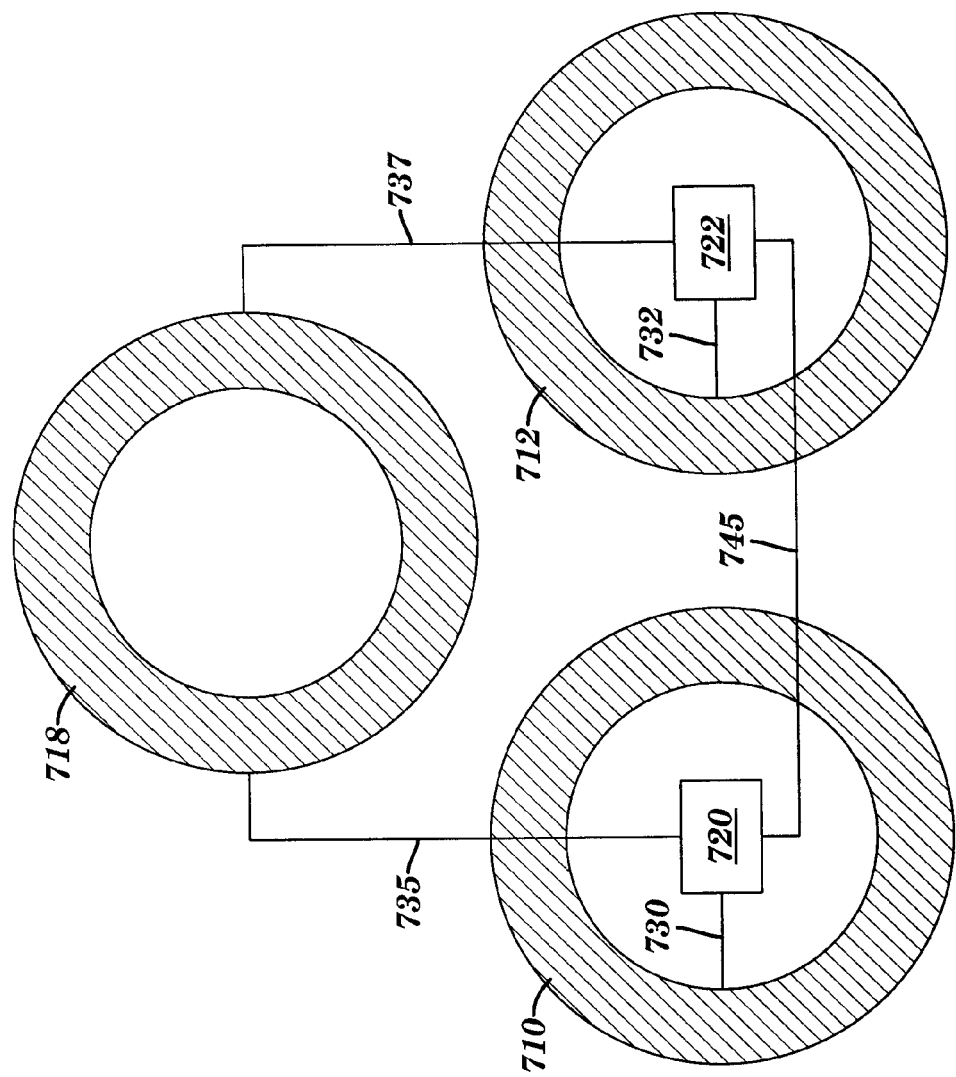
FIG. 7 illustrates a top down view of another embodiment of the invention.

FIG. 7 illustrates a top down view of another embodiment of the invention. As stated earlier the IDVMON may be located in any free space the designer finds appropriate. In this embodiment annular rings are utilized for TSV 710, 712, and 718. IDVMON 720 may be located within the annular ring 710 and IDVMON 722 may be located within the annular ring 712. IDVMON 720 may be connected to TSV 710 by line 730 as IDVMON 722 may be connected to TSV 712 by line 732. Line 745 may connect IDVMON 720 and 722 and lines 735 and 737 may connect IDVMON 720 and 722 to TSV 718.

The terminology used herein is for the purpose of describing particular embodiments only and is not intended to be limiting of the invention. For example, although the description assumes to use a common mask to a product for the IDVMON, the idea is applicable to use IDVMON unique mask to further reduce the silicon area overhead, Even if additional masks are used for IDVMON, the masks are significantly less expensive than those for the existing CA and M1 IDVMON approach, because the TSV customization is done by using much higher metal layers (i.e. metal 10). As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus comprising:
    at least two intra die variation monitors (IDVMONs);
    at least two through silicon vias (TSVs), wherein each of the at least two IDVMONs are embedded in each of the at least two TSVs; and
    at least two probe pads located on a backside of a wafer, wherein the at least two TSVs connect the at least two IDVMONs to the at least two probe pads.

2. The apparatus of claim 1 wherein the IDVMON is located in the kerf of the wafer.

3. The apparatus of claim 1 where in the through silicon vias are annular vias and the IDVMON is located within the center of one of the through silicon vias.

4. The apparatus of claim 1 wherein the IDVMON comprises at least one resistive element.

5. The apparatus of claim 1 wherein the IDVMON comprises at least one diode.

6. The apparatus of claim 1 wherein the IDVMON comprises a ring oscillator.

7. The apparatus of claim 1 wherein the IDVMON comprises a transistor.

* * * * *